United States Patent
Kasuya et al.

(10) Patent No.: US 8,022,532 B2
(45) Date of Patent: Sep. 20, 2011

(54) INTERPOSER AND SEMICONDUCTOR DEVICE

(75) Inventors: Yasumasa Kasuya, Kyoto (JP); Sadamasa Fujii, Kyoto (JP); Motoharu Haga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 207 days.

(21) Appl. No.: 11/921,573

(22) PCT Filed: Jun. 2, 2006

(86) PCT No.: PCT/JP2006/311099
§ 371 (c)(1),
(2), (4) Date: Dec. 5, 2007

(87) PCT Pub. No.: WO2006/132151
PCT Pub. Date: Dec. 14, 2006

(65) Prior Publication Data
US 2009/0115050 A1    May 7, 2009

(30) Foreign Application Priority Data

Jun. 6, 2005 (JP) ................................. 2005-165801
Aug. 22, 2005 (JP) ................................. 2005-240286

(51) Int. Cl.
*H01L 23/34* (2006.01)
(52) U.S. Cl. ........ 257/707; 257/706; 257/712; 257/717; 257/774; 257/E23.101; 257/E23.102; 257/E23.105
(58) Field of Classification Search .................. 257/717, 257/712, 774, 706, 707, E23.101, E23.102, 257/E23.105
See application file for complete search history.

(56) References Cited

U.S. PATENT DOCUMENTS

| | | | |
|---|---|---|---|
| 6,282,094 B1 * | 8/2001 | Lo et al. ......................... | 361/704 |
| 2002/0027290 A1 | 3/2002 | Sakamoto et al. | |
| 2003/0011065 A1 | 1/2003 | Sakamoto et al. | |
| 2004/0038471 A1 | 2/2004 | Sakamoto et al. | |
| 2005/0151242 A1 * | 7/2005 | Nagata et al. .................. | 257/706 |
| 2005/0206014 A1 | 9/2005 | Sakamoto et al. | |

FOREIGN PATENT DOCUMENTS

| | | |
|---|---|---|
| JP | 08-139226 A | 5/1996 |
| JP | 11-121643 | 4/1999 |
| JP | 11-154717 | 6/1999 |
| JP | 2001-181563 | 7/2001 |
| JP | 2002-158315 | 5/2002 |
| JP | 2003-008186 | 1/2003 |
| JP | 2003-297966 | 10/2003 |
| JP | 2005-101365 A | 4/2005 |

* cited by examiner

*Primary Examiner* — Matthew C Landau
*Assistant Examiner* — Jessica Hall
(74) *Attorney, Agent, or Firm* — Rabin & Berdo, PC (57) ABSTRACT

An interposer and a semiconductor device including the interposer, which can prevent thermal warpage of an insulative substrate. The interposer is provided with a semiconductor chip in a semiconductor device and may be disposed between the semiconductor chip and a mount board. The interposer includes: a substrate of an insulative resin; an island on one surface of the substrate to be bonded to a rear surface of the chip; a thermal pad on the other surface opposite the one surface opposed to the island with the intervention of the substrate; and a thermal via extending through the substrate from the one surface to the other surface to thermally connect the island to the thermal pad.

22 Claims, 4 Drawing Sheets

INTERPOSER AND SEMICONDUCTOR DEVICE

TECHNICAL FIELD

The present invention relates to an interposer and a semiconductor device including the interposer.

BACKGROUND ART

In recent years, surface-mountable packages which permit surface mounting of semiconductor devices on a wiring board are frequently employed for higher density integration of the semiconductor devices on the wiring board. BGA (Ball Grid Array) packages are known as typical examples of such surface-mountable packages.

A semiconductor device employing a BGA package includes a semiconductor chip mounted on an interposer. The interposer includes an insulative substrate of a glass epoxy resin. Provided on one surface of the insulative substrate are an island on which the semiconductor chip is bonded, and internal terminals respectively electrically connected to pads on a front surface of the semiconductor chip via bonding wires. Provided on the other surface of the insulative substrate are ball-shaped external terminals for electrical connection to lands (electrodes) provided on a mount board (printed wiring board). The insulative substrate has through-holes extending therethrough from the one surface to the other surface thereof. The through-holes are filled with a metal material. The internal terminals on the one surface of the insulative substrate are respectively electrically connected to the external terminals on the other surface via metal portions provided in the through-holes.

Patent Document 1: Japanese Unexamined Patent Publication No. 2001-181563

DISCLOSURE OF THE INVENTION

Problems to be Solved by the Invention

However, the one surface and the other surface of the insulative substrate are different in structure. Therefore, when an ambient temperature around the semiconductor device significantly changes, the insulative substrate is liable to suffer from a thermal expansion difference between the one surface and the other surface thereof, and warp (thermally warp) due to the thermal expansion difference.

Where the semiconductor chip is formed with a power IC, for example, the semiconductor chip is operative with its rear surface (a rear surface of a semiconductor substrate thereof) grounded. If the BGA package is employed for the semiconductor device including the semiconductor chip formed with the power IC, it is necessary to electrically connect the island to the external terminals and to bond the rear surface of the semiconductor chip to the island with the use of a bonding agent having electrical conductivity (an electrically conductive bonding agent). For the semiconductor device employing the BGA package, however, it is a common practice to employ an insulative bonding agent such as an epoxy resin adhesive or an insulative paste as the bonding agent for bonding the semiconductor chip to the island, but an electrically conductive bonding agent such as a solder bonding agent is not hitherto employed. Where the solder bonding agent is employed, a reflow process is indispensable. When the interposer mounted with the semiconductor chip is heated at a high temperature (e.g., about 260° C.) in the reflow process, the insulative substrate is warped due to a difference in thermal expansion degree between the one surface and the other surface of the insulative substrate.

In a semiconductor device employing a BGA package or an LGA (Land Grid Array) package, a semiconductor chip is bonded to an insulative substrate of a resin or a ceramic material having a lower thermal conductivity and, therefore, heat generated by the semiconductor chip cannot be sufficiently dissipated as compared with a semiconductor device of a QFP (Quad Flat Package) employing a lead frame having excellent thermal conductivity. This makes it difficult to keep the temperature of the semiconductor chip at a level not higher than a permissible temperature. In recent years, higher functionalities of semiconductor chips tend to increase the amounts of heat generated by the semiconductor chips. Accordingly, there is a demand for a semiconductor device having an excellent heat dissipating capability.

For example, Patent Document 2 proposes a semiconductor device which includes pads respectively connected to electrodes provided on an upper surface of a semiconductor chip via wires, and a heat-sink electrode (metal plate) on which the semiconductor chip is bonded via a bonding material, and is substantially entirely sealed with a resin with the pads and the heat-sink electrode partly uncovered. In the semiconductor device, heat generated by the semiconductor chip is dissipated through the heat-sink electrode.

However, the construction of the semiconductor device requires electrical insulation between the heat-sink electrode and the pads, so that an insulative adhesive or an insulative sheet having lower thermal conductivity should be employed as the bonding agent. Therefore, the heat is less liable to be transferred from the semiconductor chip to the heat-sink electrode, so that the heat generated by the semiconductor chip cannot be sufficiently dissipated.

Further, Patent Document 3 proposes a semiconductor device which includes a semiconductor chip of a lower surface electrode (face down) type having a multiplicity of connection electrodes provided on a lower surface (mount surface) thereof, a periphery reinforcement dummy electrode provided on a peripheral portion of the lower surface thereof and a center reinforcement dummy electrode provided on a center portion of the lower surface thereof, and an insulative substrate having connection lands provided on a front surface thereof and respectively connected to the connection electrodes, a periphery reinforcement land provided on the front surface thereof and connected to the periphery reinforcement dummy electrode and a center reinforcement land provided on the front surface thereof and connected to the center reinforcement dummy electrode. A heat-sink conductor layer is provided on a rear surface of the insulative substrate, and is connected to the center reinforcement land via a heat-sink via extending through the insulative substrate. In the semiconductor device, heat generated by the semiconductor chip can be dissipated through a heat conduction path including the center reinforcement dummy electrode, the center reinforcement land, the heat-sink via and the heat-sink conductor layer which are highly thermally conductive.

Of the electrodes provided on the semiconductor chip, however, only the center reinforcement dummy electrode is connected to the heat-sink conductor layer in the semiconductor device. With a smaller number of heat conduction paths, the semiconductor device is problematic in that the heat generated by the semiconductor chip cannot be sufficiently dissipated. Further, the center reinforcement dummy electrode is located at the center of the lower surface of the semiconductor chip, making it difficult to dissipate the heat from the entire semiconductor chip. Furthermore, the semiconductor chip is of the lower surface electrode (face down)

type. Therefore, it is difficult to provide a sufficient number of center reinforcement dummy electrodes for the heat dissipation on the lower surface of the semiconductor chip.

It is a first object of the present invention to provide an interposer and a semiconductor device including the interposer, which can prevent thermal warpage of an insulative substrate thereof.

It is a second object of the present invention to provide a semiconductor device having an excellent heat dissipating capability and to provide an interposer to be employed for the semiconductor device.

Means for Solving the Problems

An interposer according to one aspect of the present invention to achieve the aforementioned first object is an interposer which is to be provided together with a semiconductor chip in a semiconductor device and, when the semiconductor device is mounted on a mount board, disposed between the semiconductor chip and the mount board. The interposer includes: an insulative substrate of an insulative resin; an island provided on one surface of the insulative substrate to be bonded to a rear surface of the semiconductor chip via a bonding agent; a thermal pad provided on the other surface of the insulative substrate opposite from the one surface in generally opposed relation to the island with the intervention of the insulative substrate; and a thermal via extending through the insulative substrate from the one surface to the other surface to connect the island to the thermal pad in a thermally conductive manner.

A semiconductor device according to another aspect of the present invention to achieve the aforementioned first object includes: a semiconductor chip; an insulative substrate of an insulative resin; an island provided on one surface of the insulative substrate and bonded to a rear surface of the semiconductor chip via a bonding agent; a thermal pad provided on the other surface of the insulative substrate opposite from the one surface in generally opposed relation to the island with the intervention of the insulative substrate; and a thermal via extending through the insulative substrate from the one surface to the other surface to connect the island to the thermal pad in a thermally conductive manner.

The island is disposed on the one surface of the insulative substrate, while the thermal pad is disposed on the other surface of the insulative substrate opposite from the one surface in generally opposed relation to the island with the intervention of the insulative substrate. The island and the thermal pad are connected to each other in a thermally conductive manner by the thermal via extending through the insulative substrate. Therefore, even if an ambient temperature around the semiconductor device abruptly changes, a temperature (thermal) balance can be maintained between the one surface and the other surface of the insulative substrate. As a result, the insulative substrate is prevented from suffering from a thermal expansion difference between the one surface and the other surface thereof and, therefore, prevented from being thermally warped.

Particularly, the thermal pad is preferably composed of the same material and has the same configuration (plan shape and thickness) as the island. In this case, the temperature balance can be maintained between the one surface and the other surface of the insulation substrate against the change in ambient temperature around the semiconductor device, and the thermal expansion/thermal contraction of the island can be balanced with the thermal expansion/thermal contraction of the thermal pad. This further reliably prevents the insulative substrate from suffering from the thermal expansion difference between the one surface and the other surface thereof, thereby effectively preventing the thermal warpage of the insulative substrate.

The interposer preferably further includes internal terminals provided on the one surface of the insulative substrate for electrical connection to the semiconductor chip, external terminals provided on the other surface of the insulative substrate for electrical connection to lands on the mount board, and inter-terminal connection vias extending through the insulative substrate from the one surface to the other surface to respectively electrically connect the internal terminals to the external terminals.

With this arrangement, the internal terminals on the one surface of the insulative substrate are respectively electrically connected to the external terminals on the other surface by the inter-terminal connection vias. Therefore, the electrical connection between the lands and the internal terminals and hence the electrical connection between the lands and the semiconductor chip are achieved by electrically connecting the external terminals to the lands of the mount board.

The interposer preferably further includes a thermal bump provided on the thermal pad and adapted to abut against the mount board with the semiconductor device mounted on the mount board.

With this arrangement, the thermal bump provided on the thermal pad abuts against the mount board with the semiconductor device mounted on the mount board. Therefore, the heat is released from the thermal pad to the mount board through the thermal bump. As a result, the heat dissipating capability of the semiconductor device is improved.

The island, the thermal pad, the thermal via and the thermal bump are preferably electrically conductive, and the bonding agent is preferably composed of a metal material. The thermal bump is preferably adapted to abut against a ground terminal on the mount board with the semiconductor device mounted on the mount board.

With this arrangement, when the thermal bump is connected to the ground electrode on the mount board with the semiconductor device mounted on the mount board, the ground electrode is electrically connected to the rear surface of the semiconductor chip through the thermal bump, the thermal pad, the thermal via and the island, because the island, the thermal pad, the thermal via and the thermal bump are electrically conductive and the bonding agent is composed of the metal material. Therefore, the rear surface of the semiconductor chip is kept at a ground potential with the semiconductor device mounted on the mount board. Hence, a semiconductor chip such as formed with a power IC and operative with its rear surface grounded may be employed as the semiconductor chip. In this case, proper operation of the semiconductor chip (e.g., proper operation of the power IC) is ensured.

The bonding agent is preferably a high melting point solder.

The high melting point solder is herein defined as a solder having a melting point of not lower than 260° C.

With this arrangement, when the rear surface of the semiconductor chip is bonded to the island with the use of the high melting point solder, a reflow process is required. However, even if the interposer mounted with the semiconductor chip is heated at a high temperature on the order of not lower than 260° C. in the reflow process, the temperature (thermal) balance can be maintained between the one surface and the other surface of the insulative substrate. As a result, it is possible to prevent the insulative substrate from suffering from the thermal expansion difference between the one surface and the other surface thereof, thereby preventing the thermal warpage of the insulative substrate.

The thermal vias are preferably arranged at a higher density than the inter-terminal connection vias.

With this arrangement, a broader heat conduction path extending from the island to the thermal pad can be provided. Therefore, the heat generated by the semiconductor chip is advantageously transferred to the thermal pad, so that the semiconductor device has an excellent heat dissipating capability.

An interposer according to one aspect of the present invention to achieve the aforementioned second object includes: an insulative substrate having via-holes arranged in a matrix array with an electrically conductive island provided on a front surface thereof; wherein the insulative substrate has a heat dissipation via-hole provided in addition to the via-holes arranged in the matrix array in a region thereof opposed to the island.

A semiconductor device according to another aspect of the present invention to achieve the aforementioned second object includes: an insulative substrate having via-holes arranged in a matrix array with an electrically conductive island provided on a front surface thereof; and a semiconductor chip die-bonded to the island via an electrically conductive layer; wherein the insulative substrate has a heat dissipation via-hole provided in addition to the via-holes arranged in the matrix array in a region thereof opposed to the island.

The electrically conductive island on which the semiconductor chip is die-bonded contacts substantially the entire lower surface of the semiconductor chip via the electrically conductive layer. The via-holes arranged in the matrix array and the heat dissipation via-hole are disposed below the island. Therefore, the electrically conductive layer and the island each having a higher electrical conductivity, the via-holes and the heat dissipation via-hole provide a broader heat conduction path for dissipating heat generated by the semiconductor chip. As a result, the semiconductor device has an excellent heat dissipating capability.

The matrix array herein means that the via-holes are located at plane lattice points to be aligned in rows and columns. However, the rows and the columns are not necessarily required to be orthogonally intersect each other, but may form a predetermined angle (e.g., 60 degrees).

Metal terminals are preferably provided on a rear surface of the insulative substrate and respectively electrically connected to the via-holes in the region of the insulative substrate opposed to the island.

With this arrangement, the highly electrically conductive metal terminals (solder bumps or the like) are respectively electrically connected to the via-holes. Therefore, heat transferred from the semiconductor chip through the heat conduction path can be released to the outside (a printed wiring board or the like) through the metal terminals, so that the heat dissipating capability can be improved. Further, ground electrodes may be provide on a lower surface (mount surface) of the semiconductor chip and the metal terminals may be connected to electrodes of a printed wiring board or the like, whereby the metal terminals serve as ground electrodes of the semiconductor device.

The via-holes and/or the heat dissipation via-hole are preferably filled with a metal filler.

With this arrangement, the heat generated by the semiconductor chip can be more advantageously dissipated, because the via-holes and/or the heat dissipation via-hole are filled with the highly electrically conductive metal filler. As a result, the heat dissipating capability can be further enhanced.

The foregoing and other objects, features and effects of the present invention will become more apparent from the following detailed description of embodiments with reference to the attached drawings.

BEST MODE FOR CARRYING OUT THE INVENTION

Embodiments of the present invention will hereinafter be described in detail with reference to the attached drawings.

Figure 1:
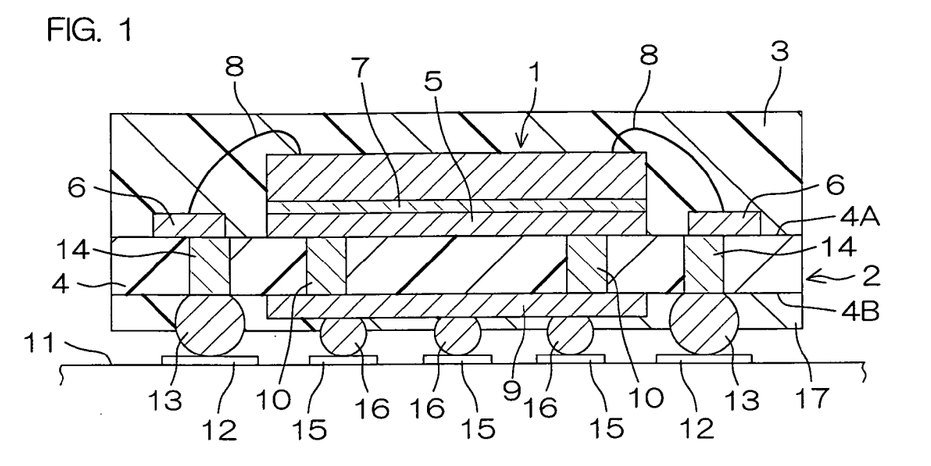
FIG. 1 is a sectional view schematically illustrating the construction of a semiconductor device according to one embodiment of the present invention.

FIG. 1 is a sectional view schematically illustrating the construction of a semiconductor device according to one embodiment of the present invention. The semiconductor device is a semiconductor device employing a BGA (Ball Grid Array) package, and includes a semiconductor chip 1, an interposer 2 on which the semiconductor chip 1 is mounted, and a resin seal 3 which seals the semiconductor chip 1 and a surface of the interposer 2 opposed to the semiconductor chip 1.

A semiconductor substrate (e.g., a silicon substrate) serving as a base of the semiconductor chip 1 is formed, for example, with a power IC. An outermost surface of the semiconductor chip 1 is covered with a surface protective film, and a plurality of pads (not shown) are provided on a peripheral portion of the outermost surface of the semiconductor chip 1 as being exposed from the surface protective film.

The interposer 2 includes an insulative substrate 4 of an insulative resin (e.g., a glass epoxy resin).

An island 5 of a rectangular thin plate shape having substantially the same size as the semiconductor chip 1 as seen in plan is provided on a center portion of one surface (upper surface) 4A of the insulative substrate 4. A plurality of internal terminals 6 are provided on a peripheral portion of the one surface 4A of the insulative substrate 4 as surrounding the island 5. The island 5 and the internal terminals 6 are each composed of a metal such as copper and, therefore, are electrically conductive.

A rear surface of the semiconductor chip 1 is bonded to the island 5 via a bonding agent 7 of a high melting point solder (a solder having a melting point of not lower than 260° C.). The internal terminals 6 are respectively connected (wire-bonded) to the pads on the front surface of the semiconductor chip 1, for example, via bonding wires 8 of gold thin wires.

Thus, the rear surface of the semiconductor chip 1 (the rear surface of the semiconductor substrate) is electrically connected to the island 5 via the bonding agent 7, and an internal circuit (not shown) of the semiconductor chip 1 is electrically connected to the internal terminals 6 via the bonding wires 8.

On the other hand, a thermal pad 9 having substantially the same configuration (plan shape and thickness) as the island 5 and composed of the same metal material as the island 5 is provided on a center portion of the other surface (lower surface) 4B of the insulative substrate 4 (in opposed relation to the island 5 with the intervention of the insulative substrate 4). A plurality of thermal vias 10 extend through the insulative substrate 4 between the island 5 and the thermal pad 9 to connect the island 5 and the thermal pad 9 in a thermally conductive manner. The thermal vias 10 are formed, for example, by forming via-holes extending through the insulative substrate 4 and filling the via-holes with a metal material (e.g., copper). Thus, the island 5 and the thermal pad 9 are connected to each other via the plurality of thermal vias 10 in a thermally and electrically conductive manner.

Figure 2:
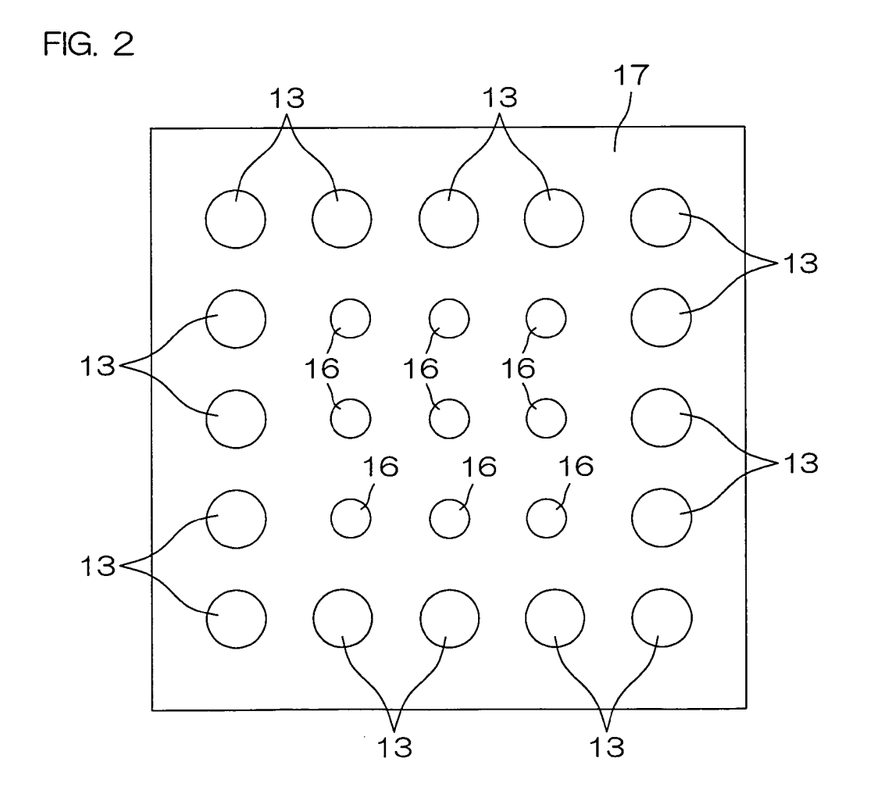
FIG. 2 is a schematic plan view of a surface of the semiconductor device of FIG. 1 opposed to a mount board.

A plurality of external terminals 13 for electrical connection to lands (electrodes) 12 on a mount board (printed wiring board) 11 are provided on a peripheral portion of the other surface 4B of the insulative substrate 4 as surrounding the thermal pad 9. The external terminals 13 are each formed of a metal material such as a solder as having a ball shape. The external terminals 13 are respectively disposed in opposed relation to the internal terminals 6 with the intervention of the insulative substrate 4, and wholly arranged in rectangular frame like configuration along the peripheral portion of the other surface 4B of the insulative substrate 4 as shown in FIG. 2. The external terminals 13 are respectively electrically connected to the internal terminals 6 opposed thereto via inter-terminal connection vias 14 each extending through the insulative substrate 4. The inter-terminal connection vias 14 are formed, for example, by forming via-holes extending through the insulative substrate 4 and filling the via-holes with a metal material (e.g., copper).

A plurality of thermal bumps 16 for connection to ground electrodes 15 on the mount board 11 are provided on the other surface 4B of the insulative substrate 4. The thermal bumps 16 are each formed of a metal material such as a solder as having a ball-shape, and disposed on the thermal pad 9.

The other surface 4B of the insulative substrate 4 is covered with a solder resist layer 17. The external terminals 13 and the thermal bumps 16 partly project from the solder resist layer 17.

Surface mounting of the semiconductor device on the mount board 11 is achieved by connecting the external terminals 13 to the lands 12 on the mount board 11 with the other surface 4B of the insulative substrate 4 opposed to the mount board 11. That is, the internal terminals 6 on the one surface 4A of the insulative substrate 4 are respectively electrically connected to the external terminals 13 on the other surface 4B via the inter-terminal connection vias 14, so that the electrical connection between the lands 12 and the internal terminals 6 and hence the electrical connection between the lands 12 and the semiconductor chip 1 can be achieved.

Further, the thermal bumps 16 are respectively connected to the ground electrodes 15 on the mount board 11 with the semiconductor device mounted on the mount board 11, whereby the rear surface of the semiconductor chip 1 is electrically connected to the ground electrodes 15 through the bonding agent 7 of the high melting point solder, the island 5, the thermal vias 10, the thermal pad 9 and the thermal bumps 16. Thus, the rear surface of the semiconductor chip 1 is kept at a ground potential, thereby ensuring proper operation of the semiconductor chip 1 (proper operation of the power IC).

Where the rear surface of the semiconductor chip 1 is thus bonded to the island 5 by the bonding agent 7 of the high melting point solder, the electrical connection between the rear surface of the semiconductor chip 1 and the island 5 is achieved by the electrical conductivity of the bonding agent 7. Where the bonding agent 7 of the high melting point solder is used, a reflow process is required for melting the bonding agent 7 after the bonding agent 7 is applied (a high melting point solder paste is applied) onto the island 5 and the rear surface of the semiconductor chip 1 is bonded onto the island 5. In the reflow process, the semiconductor chip 1 and the interposer 2 are heated at a high temperature on the order of not lower than 260° C. At this time, the insulative substrate 4 is liable to be thermally warped, if a temperature imbalance occurs between the one surface 4A and the other surface 4B of the insulative substrate 4 and hence a thermal expansion difference occurs between the one surface 4A and the other surface 4B of the insulative substrate 4.

To cope with this, the thermal pad is provided on the other surface 4B of the insulative substrate 4 in opposed relation to the island with the intervention of the insulative substrate, and the island 5 and the thermal pad 9 are connected to each other in a thermally conductive manner by the thermal vias 10 extending through the insulative substrate 4. Therefore, even if an ambient temperature around the semiconductor device is abruptly changed in the reflow process, a temperature (thermal) balance can be maintained between the one surface 4A and the other surface 4B of the insulative substrate 4. As a result, it is possible to prevent the insulative substrate 4 from suffering from the thermal expansion difference between the one surface 4A and the other surface 4B thereof, thereby preventing the thermal warpage of the insulative substrate 4.

Further, the thermal pad 9 is composed of the same metal material as the island 5, and has the same shape as the island 5. Therefore, the temperature balance can be maintained between the one surface 4A and the other surface 4B of the insulative substrate 4 against the change in ambient temperature around the semiconductor device, and the thermal expansion/thermal contraction of the island 5 can be balanced with the thermal expansion/thermal contraction of the thermal pad 9. This more reliably prevents the thermal expansion difference between the one surface 4A and the other surface 4B of the insulative substrate 4, thereby effectively preventing the thermal warpage of the insulative substrate 4.

In addition, the thermal bumps 16 provided on the thermal pad 9 are respectively connected to the ground electrodes 15 on the mount board 11 with the semiconductor device mounted on the mount board 11, so that the heat is released from the thermal pad 9 to the mount board 11 through the thermal bumps 16.

In this embodiment, the island 5 has substantially the same size as the semiconductor chip 1 as seen in plan, but the size of the island 5 may be greater or smaller than the size of the semiconductor chip 1 as seen in plan.

Further, the high melting point solder is employed as the bonding agent 7 by way of example, but the bonding agent 7 may be, for example, a silver paste which is electrically conductive and capable of bonding (joining) the rear surface of the semiconductor chip 1 to the island 5.

Figure 3:
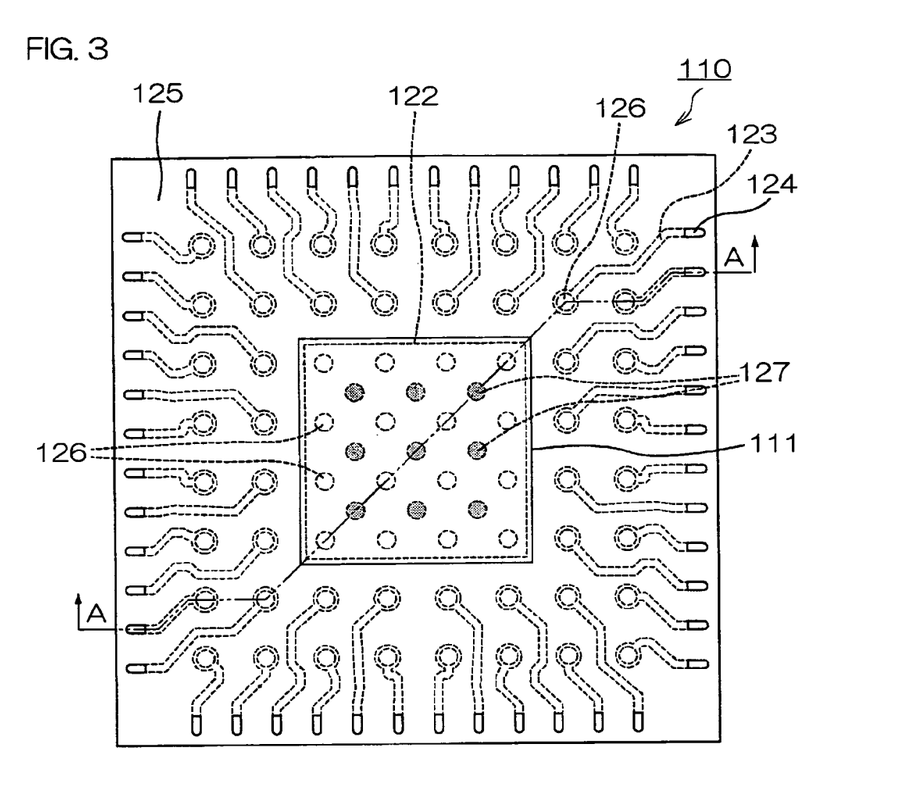
FIG. 3 is a plan view schematically illustrating the construction of a semiconductor device according to a second embodiment of the present invention.
Figure 6:
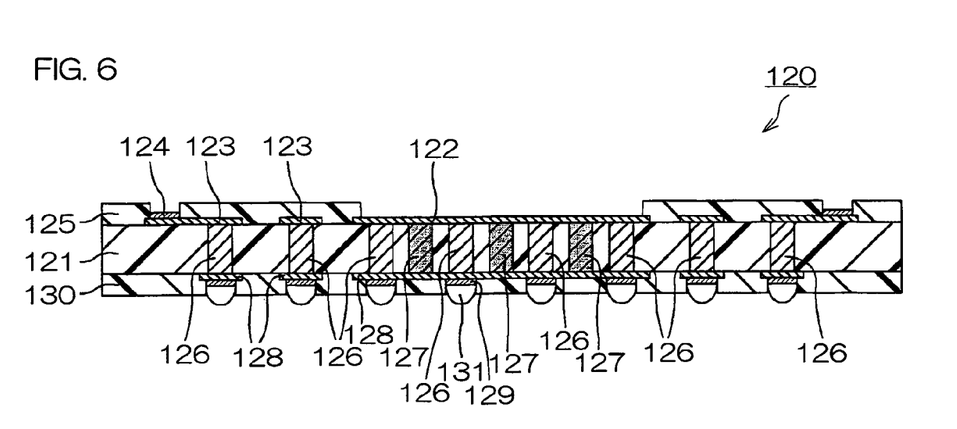
FIG. 6 is a schematic sectional view of an interposer provided in the semiconductor device shown in FIG. 4.

FIG. 3 is a plan view schematically illustrating a semiconductor device according to a second embodiment of the present invention. FIG. 6 is a sectional view (a sectional view taken along a line A-A) of the semiconductor device shown in FIG. 3.

An insulative substrate 121 provided in a semiconductor device 110 is composed of a material obtained by impregnating glass fibers with a bismaleimide-triazine resin (BT resin). The insulative substrate 121 is not particularly limited, as long as it is insulative. Examples of the insulative substrate include substrates of bismaleimide-triazine resins (BT resins), epoxy resins, polyester resins, polyimide resins and phenol resins, substrates obtained by impregnating reinforcement materials such as glass fibers with any of these resins, and ceramic substrates.

An island 122 having substantially the same area as a lower surface (mount surface) of a semiconductor chip 111 is provided on a center portion of a front surface of the insulative substrate 121. The island 122 is formed of a Cu layer. An Ni layer and/or an Au layer may be provided on the Cu layer. The island 122 is not particularly limited, as long as it is electrically conductive.

A plurality of conductor circuits 123 of Cu layers are provided on a peripheral portion of the front surface of the insulative substrate 121. The conductor circuits 123 each have a pattern such as to extend from a peripheral portion to a center portion of the semiconductor device 110 (see FIG. 3). End portions of the respective conductor circuits 123 located on the peripheral side are equidistantly arranged along peripheral edges of the semiconductor device 110, and bonding pads 124 are respectively provided on upper surfaces of the end portions. The bonding pads 124 are each formed of an Ni layer, an Au layer or the like.

The front surface of the insulative substrate 121 except for the island 122 and the bonding pads 124 is covered with a solder resist layer 125.

The semiconductor chip 111 is die-bonded to the island 122 via an electrically conductive layer 112. Any of various types of semiconductor chips may be employed as the semiconductor chip 111, and the specific function and the internal circuit configuration of the semiconductor chip are not particularly limited.

The semiconductor chip 111 has a plurality of electrodes 111a provided in an upper surface thereof. The electrodes 111a are respectively electrically connected to the bonding pads 124 via wires 114. In FIG. 3, the electrodes 111a and the wires 114 are not shown for convenience of explanation.

The insulative substrate 121 has 64 via-holes 126 arranged in a matrix array (8×8) in the entire region thereof including regions inside and outside an island formation region (which contacts the island 122) (see FIG. 3). Of the 64 via-holes 126, 4×4 via-holes 126 are located in the island formation region. The via-holes 126 each have a diameter of about 120 to about 150 μm. The via-holes 126 are such that metal thin films are provided on sidewalls of through-holes formed in the insulative substrate 121 by electroless plating or electrolytic plating and the through-holes are filled with a filler.

In addition to the 4×4 via-holes 126, nine heat dissipation via-holes 127 are provided in the island formation region of the insulative substrate 121 (see FIG. 3). The heat dissipation via-holes 127 are each equidistantly spaced from four adjacent via-holes 126. The heat dissipation via-holes 127 are such that metal thin films are provided on sidewalls of through-holes formed in the insulative substrate 121 by electroless plating or electrolytic plating and the through-holes are filled with a filler. That is, the heat dissipation via-holes 127 each have the same shape and structure as the via-holes 126. In FIG. 3 and the subsequent figures, the heat dissipation via-holes 127 are hatched for easy discrimination between the via-holes 126 and the heat dissipation via-holes 127.

The via-holes 126 and the heat dissipation via-holes 127 provided in the island formation region are electrically connected to the island 122. The via-holes 126 and the heat-dissipation via-holes 127 may be isolated from the island 122, though this embodiment is directed to a case in which the via-holes 126 and the heat dissipation via-holes 127 are electrically connected to the island 122.

A conductor layer 128 having substantially the same area as the island 122 is provided on a center portion of a rear surface of the insulative substrate 121, and the via-holes 126 and the heat dissipation via-holes 127 are electrically connected to the conductor layer 128. Further, conductor layers 128 respectively electrically connected to the via-holes 126 are provided on a peripheral portion of the rear surface of the insulative substrate 121. These conductor layers 128 are each formed of a Cu layer. The rear surface of the insulative substrate 121 is covered with a solder resist layer 130 with the conductor layers 128 (associated with the via-holes 126) partly exposed.

Solder pads 29 such as of Ni layers or Au layers are provided on the exposed portions of the conductor layers 128, and solder bumps (metal terminals) 31 are respectively provided on the solder pads 29. This embodiment is directed to a case in which the solder bumps 31 are preliminarily formed on the rear surface of the insulative substrate 121, but the semiconductor device may be adapted to be directly mounted on a printed wiring board, for example, with the use of solder balls or a solder paste.

The semiconductor device 110 includes a resin package portion 119 which seals the semiconductor chip 111 as covering the entire upper surface of the insulative substrate 121. The resin package portion 119 is composed of, for example, a resin composition containing an epoxy resin or the like. In FIG. 3, the resin package portion 119 is not shown.

The island 122 on which the semiconductor chip 111 is die-bonded contacts substantially the entire lower surface of the semiconductor chip 111 via the electrically conductive layer 112. The via-holes 126 arranged in the matrix array and the heat dissipation via-holes 127 are disposed below the island 122. Therefore, the electrically conductive layer 112, the island 122, the via-holes 126 and the heat-dissipation via-holes 127, which are highly electrically conductive, provide a broader heat conduction path for dissipation of heat generated by the semiconductor chip 111 as shown in FIG. 6. Thus, the semiconductor device has an excellent heat dissipating capability.

From the viewpoint of the thermal conduction, there is no need to discriminate the via-holes 126 and the heat dissipation via-holes 127, which may be regarded as thermal vias which connect the island 122 to the conductor layer 128 as a thermal pad in a thermally conductive manner.

The solder bumps (metal terminals) 31 respectively electrically connected to the via-holes 126 are preferably provided in the island formation region on the rear surface of the insulative substrate 121. With the highly thermally conductive solder bumps 31 electrically connected to the via-holes 126, heat transferred from the semiconductor chip 111 to the via-holes 126 is released to the outside (the printed wiring board or the like) through the solder bumps 31. Therefore, the heat dissipating capability can be further enhanced.

The via-holes 126 and/or the heat dissipation via-holes 127 are preferably filled with a highly thermally conductive metal filler. In this case, the heat generated by the semiconductor chip 111 is more advantageously dissipated. As a result, the heat dissipating capability can be further enhanced.

This embodiment is directed to a case in which the heat dissipation via-holes 127 each have the same diameter as the via-holes 126 and are each equidistantly spaced from four adjacent via-holes 126. However, the shape and the layout of the heat dissipation via-holes 127 are not particularly limited. For example, an arrangement as shown in FIG. 5A or 5B may be employed.

Figure 5A:
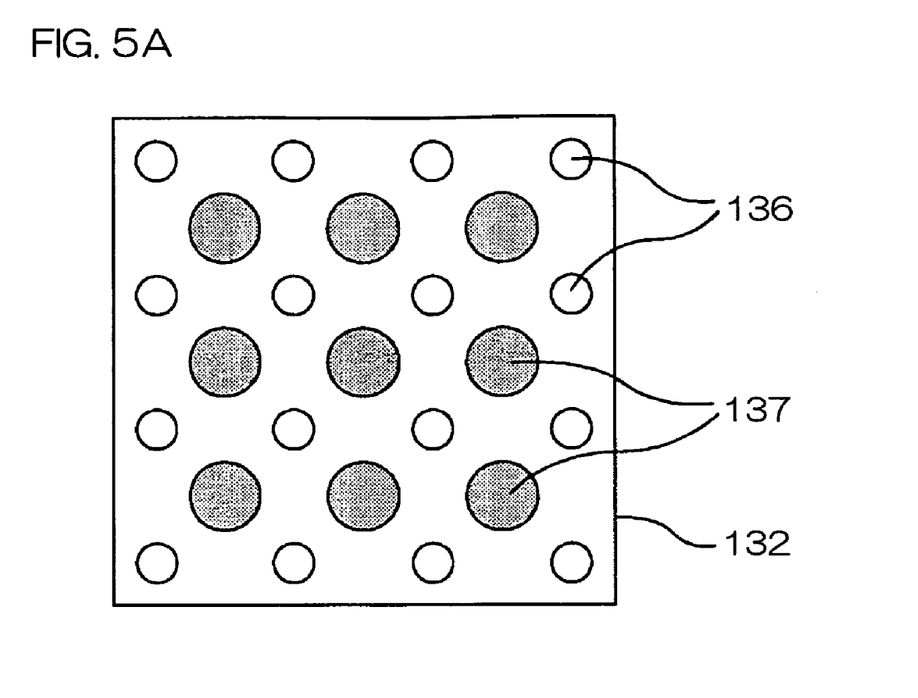
FIG. 5A is a plan view schematically illustrating a portion of an insulative substrate in an island formation region of a semiconductor device according to a third embodiment of the present invention.
Figure 5B:
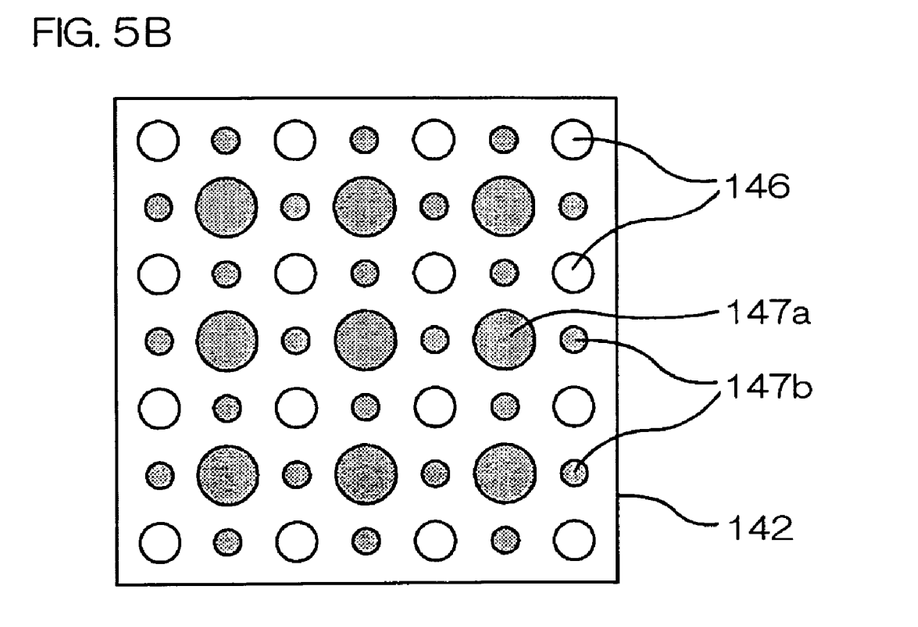
FIG. 5B is a plan view schematically illustrating a portion of an insulative substrate in an island formation region of a semiconductor device according to a fourth embodiment of the present invention.

FIG. 5A is a plan view schematically illustrating a portion of an insulative substrate in an island formation region of a semiconductor device according to a third embodiment of the present invention.

In an insulative substrate 132, 16 via-holes 136 are arranged in a matrix array (4×4) in an island formation region. Further, heat dissipation via-holes 137 are arranged between the via-holes 136, i.e., are each equidistantly spaced from four adjacent via-holes 136. However, the heat dissipation via-holes 137 are greater in diameter than the via-holes 136.

With the heat dissipation via-holes 137 thus each having a greater diameter than the via-holes 136, a broader heat conduction path can be provided, thereby enhancing the heat dissipating effect. Further, it is desirable to increase the diameter of each of the heat dissipation via-holes 137 and reduce the number of the through-holes to provide the same total opening area while suppressing a cost increase.

FIG. 5B is a plan view schematically illustrating a portion of an insulative substrate in an island formation region of a semiconductor device according to a fourth embodiment of the present invention.

In an insulative substrate 142, 16 via-holes 146 are arranged in a matrix array (4×4) in an island formation region. Further, heat dissipation via-holes include first heat dissipation via-holes 147a each having a greater diameter than the via-holes 146, and second heat dissipation via-holes 147b each having a smaller diameter than the via-holes 146. The first heat dissipation via-holes 147a are arranged between the via-holes 146, i.e., are each equidistantly spaced from four adjacent via-holes 146. The second heat dissipation via-holes 147b are each disposed between two adjacent via-holes 146.

Thus, the heat dissipation via-holes are not necessarily required to have the same diameter, but heat dissipation via-holes 147a, 147b having different diameters may coexist. The provision of the heat dissipation via-holes 147a, 147b having different diameters increases the total opening area of the heat dissipation via-holes 147a, 147b, while ensuring sufficient mechanical strength of the insulative substrate 142.

In the present invention, as shown in FIGS. 3, 5A and 5B, the heat dissipation via-holes are desirably disposed between all adjacent pairs of via-holes arranged in the matrix array in the island formation region. This permits uniform heat dissipation from the entire semiconductor chip, thereby preventing local temperature increase of the semiconductor chip.

Figure 4:
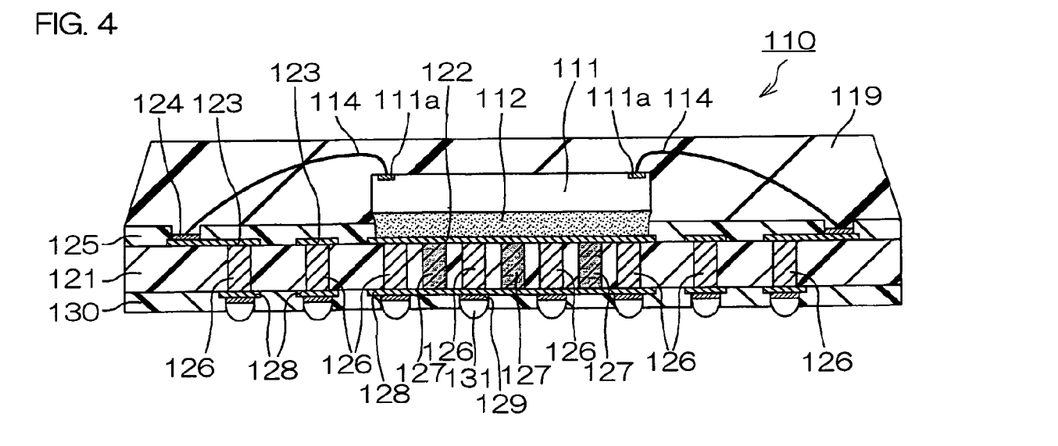
FIG. 4 is a schematic sectional view (a sectional view taken along a line A-A) of the semiconductor device shown in FIG. 3.

FIG. 6 is a schematic sectional view of an interposer provided in the semiconductor device 110 shown in FIG. 4.

The semiconductor device 110 can be produced as having excellent heat dissipating capability by employing the interposer 120.

Next, a method for producing the interposer 120 and a method for producing the semiconductor device 110 by employing the interposer 120 will be described.

(A) An insulative substrate 121 is employed as a starting material. First, an island 122 and conductor circuits 123 are formed on a front surface of the insulative substrate 121, and conductor layers 128 are formed on a rear surface of the insulative substrate 121. The formation of the island 122, the conductor circuits 123 and the conductor layers 128 is achieved by forming plain metal layers on the opposite surfaces of the insulative substrate 121 by electroless plating or the like, and then etching the metal layers. Alternatively, the formation may be achieved by etching a copper-coated substrate.

(B) Through-holes (hereinafter referred to as first through-holes) are formed in the insulative substrate 121 as being arranged in a matrix array by a drill or laser. The first through-holes later serve as via-holes 126. The first through-holes each have a diameter of, for example, about 120 to about 150 μm.

Further, through-holes (hereinafter referred to as second through-holes) are formed in an island formation region as being arranged in a matrix array by a drill or laser. The second through-holes later serve as heat dissipation via-holes 127. The diameter of each of the second through-holes is not particularly limited.

Where the second through-holes each have the same diameter as the first through-holes, the settings of an apparatus employed for the formation of the first through-holes can be employed as they are for the formation of the second through-holes, so that an increase in labor required for the formation of the through-holes can be suppressed. On the other hand, where the second through-holes are different in diameter from the first through-holes (through-holes having different diameters coexist), it is possible to form a multiplicity of through-holes while providing sufficient spacings between the through-holes. Therefore, the heat dissipating effect can be enhanced. The second through-holes are not necessarily required to have the same diameter, but may include plural types of second through-holes having different diameters. Further, it is desirable to increase the diameter of each of the through-holes and reduce the number of the through-holes to provide the same total opening area while suppressing a cost increase.

Then, metal thin films are formed on sidewalls of the through-holes (the first through-holes and the second through-holes) by performing electroless plating and then electrolytic plating, and the through-holes are filled with a filler. Thus, the via-holes 126 and the heat dissipation via-holes 127 are formed. The filler is not particularly limited, but examples thereof include resin fillers and metal fillers. Desirably, the metal fillers are used in order to broaden the heat conduction path for enhancement of the heat dissipating effect. Examples of the metal fillers include electrically conductive pastes containing metal particles. The formation of the via-holes 126 and the heat dissipation via-holes 127 may be achieved by filling the through-holes by plating. Alternatively, the via-holes 126 and the heat dissipation via-holes 127 may be lidded by plating.

(C) Next, an uncured solder resist composition is applied onto the front surface of the insulative substrate 121 by means of a roll coater or a curtain coater, or a film of the solder resist composition is press-bonded onto the front surface, and then the solder resist composition is cured. Thus, a solder resist layer 125 is formed. Further, a solder resist layer 130 is formed on the rear surface of the insulative substrate 121 in the same manner.

In turn, openings are formed at predetermined positions in the solder resist film 125 by a laser process or a photolithography process, and portions of the resulting substrate exposed from the solder resist film 125 are plated by Ni plating or Au plating. Thus, the island 122 is coated with an Ni layer or an Au layer, and bonding pads 124 are formed. Further, solder pads 29 are formed by performing substantially the same process on the solder resist layer 130. Then, solder bumps 31 are formed by applying a solder paste or placing solder balls on the solder pads 29, and performing a reflow process.

The interposer 120 is thus produced through the steps (A) to (C) (see FIG. 6).

(D) Subsequently, a solder paste or an Ag paste is applied onto the island 122 of the interposer 120, and a semiconductor chip 111 is mounted on the applied solder paste. Then, a reflow process is performed. Thus, the semiconductor chip 111 is die-bonded to the island 122 via an electrically conductive layer 112

Electrodes 111a provided in an upper surface of the semiconductor chip 111 are respectively wire-bonded to the bonding pads 124 with the use of wires. Then, a resin package portion 119 is formed from a resin composition containing an epoxy resin or the like as covering the entire upper surface of the insulative substrate 121. Thus, the semiconductor device 110 is produced.

In the arrangements shown in FIGS. 3 to 6, the via-holes located inside the island formation region may be different in diameter from the via-holes located outside the island formation region.

While the embodiments of the present invention have been described, the present invention may be embodied in other ways. For example, the insulative substrate is a single layer substrate in the embodiments described above, but may be a substrate prepared by stacking a plurality of plates.

Further, the island has a rectangular shape having substantially the same size as the lower surface (mount surface) of the semiconductor chip in the embodiments described above, but the shape of the island is not particularly limited.

The embodiments described above are directed to the semiconductor device employing the BGA, but the present invention may be applied to a semiconductor device employing a so-called LGA (Land Grid Array) in which a plurality of lands (external terminals each having a thin plate shape) are arranged on the insulative substrate. Further, the package type is not limited to the surface-mountable packages such as BGA and LGA, but the present invention may be applied to a semiconductor device employing an insertion type mount package which achieves the mounting of the semiconductor device on a mount board by inserting leads of the semiconductor device into through-holes formed in the mount board.

Besides, various modifications may be made within the scope of the appended claims. It should be understood that the embodiments described above are merely illustrative of the technical principles of the present invention but not limitative of the invention. The spirit and scope of the present invention are to be limited only by the appended claims.

This application corresponds to Japanese Patent Application No. 2005-165801 filed in the Japanese Patent Office on Jun. 6, 2005, and Japanese Patent Application No. 2005-240286 filed in the Japanese Patent Office on Aug. 22, 2005, the disclosure of which is incorporated herein by reference.

What is claimed is:

1. An interposer to be provided together with a semiconductor chip in a semiconductor device and, when the semiconductor device is mounted on a mount board, disposed between the semiconductor chip and the mount board, the interposer comprising:
   an insulative substrate of an insulative resin;
   an island provided on one surface of the insulative substrate to be bonded to a rear surface of the semiconductor chip via a bonding agent;
   a thermal pad provided on the other surface of the insulative substrate opposite from the one surface in generally opposed relation to the island with the intervention of the insulative substrate;
   thermal vias extending through the insulative substrate from the one surface to the other surface to connect the island to the thermal pad in a thermally conductive manner;
   metal terminals formed on the other surface of the insulative substrate; and
   connection vias, being different from thermal vias, extending through the insulative substrate from the one surface to the other surface to be connected to the metal terminals respectively,
   wherein the thermal vias include a first thermal via having a relatively-large diameter and a second thermal via having a relatively-small diameter, and
   each of the connection vias has a diameter that is smaller than the diameter of the first thermal via and larger than the diameter of the second thermal via.

2. The interposer according to claim 1, further comprising:
   internal terminals provided on the one surface of the insulative substrate for electrical connection to the semiconductor chip;
   external terminals provided on the other surface of the insulative substrate for electrical connection to lands on the mount board; and
   inter-terminal connection vias extending through the insulative substrate from the one surface to the other surface to respectively electrically connect the internal terminals to the external terminals.

3. The interposer according to claim 2, further comprising a thermal bump provided on the thermal pad and adapted to abut against the mount board with the semiconductor device mounted on the mount board.

4. The interposer according to claim 3,
   wherein the island, the thermal pad, the thermal via and the thermal bump are electrically conductive,
   wherein the bonding agent is composed of a metal material,
   wherein the thermal bump is adapted to abut against a ground terminal on the mount board with the semiconductor device mounted on the mount board.

5. The interposer according to claim 4, wherein the bonding agent is a high melting point solder.

6. The interposer according to claim 2, wherein the thermal vias are arranged at a higher density than the inter-terminal connection vias.

7. The interposer according to claim 1, wherein the first thermal via and the second thermal via are arranged alternately.

8. An interposer comprising:
   an insulative substrate having via-holes arranged in a matrix array with an electrically conductive island provided on a front surface thereof;
   wherein the insulative substrate has heat dissipation via-holes provided in addition to the via-holes arranged in the matrix array in a region thereof opposed to the island,
   the heat dissipation via-holes include a first heat dissipation via-hole having a relatively-large diameter and a second heat dissipation via-hole having a relatively-small diameter, and
   each of the connection via-holes has a diameter that is smaller than the diameter of the first heat dissipation via-hole and larger than the diameter of the second heat dissipation via-hole.

9. The interposer according to claim 8, wherein metal terminals are provided on a rear surface of the insulative substrate and respectively electrically connected to the via-holes in the region of the insulative substrate opposed to the island.

10. The interposer according to claim 9, wherein the via-holes and/or the heat dissipation via-hole are filled with a metal filler.

11. The interposer according to claim 8, wherein the first heat dissipation via-hole and the second heat dissipation via-hole are arranged alternately.

12. A semiconductor device comprising:

a semiconductor chip;

an insulative substrate of an insulative resin;

an island provided on one surface of the insulative substrate and bonded to a rear surface of the semiconductor chip via a bonding agent;

a thermal pad provided on the other surface of the insulative substrate opposite from the one surface in generally opposed relation to the island with the intervention of the insulative substrate;

thermal vias extending through the insulative substrate from the one surface to the other surface to connect the island to the thermal pad in a thermally conductive manner;

metal terminals formed on the other surface of the insulative substrate; and connection vias, being different from thermal vias, extending through the insulative substrate from the one surface to the other surface to be connected to the metal terminals respectively, wherein the thermal vias include a first thermal via having a relatively-large diameter and a second thermal via having a relatively-small diameter, and each of the connection vias has a diameter that is smaller than the diameter of the first thermal via and larger than the diameter of the second thermal via.

13. The semiconductor device according to claim 12, further comprising:

internal terminals provided on the one surface of the insulative substrate and electrically connected to the semiconductor chip;

external terminals provided on the other surface of the insulative substrate for electrical connection to lands on a mount board on which the semiconductor device is mounted; and inter-terminal connection vias extending through the insulative substrate from the one surface to the other surface to respectively electrically connect the internal terminals to the external terminals.

14. The semiconductor device according to claim 13, further comprising a thermal bump provided on the thermal pad and adapted to abut against the mount board with the semiconductor device mounted on the mount board.

15. The semiconductor device according to claim 14, wherein the island, the thermal pad, the thermal via and the thermal bump are electrically conductive, wherein the bonding agent is composed of a metal material, wherein the thermal bump is adapted to abut against a ground terminal on the mount board with the semiconductor device mounted on the mount board.

16. The semiconductor device according to claim 15, wherein the bonding agent is a high melting point solder.

17. The semiconductor device according to claim 13, wherein the thermal vias are arranged at a higher density than the inter-terminal connection vias.

18. The semiconductor device according to claim 12, wherein the first thermal via and the second thermal via are arranged alternately.

19. A semiconductor device comprising:

an insulative substrate having via-holes arranged in a matrix array with an electrically conductive island provided on a front surface thereof; and a semiconductor chip die-bonded to the island via an electrically conductive layer;

wherein the insulative substrate has heat dissipation via-holes provided in addition to the via-holes arranged in the matrix array in a region thereof opposed to the island, the heat dissipation via-holes include a first heat dissipation via-hole having a relatively-large diameter and a second heat dissipation via-hole having a relatively-small diameter, and each of the connection via-holes has a diameter that is smaller than the diameter of the first heat dissipation via-hole and larger than the diameter of the second heat dissipation via-hole.

20. The semiconductor device according to claim 19, wherein metal terminals are provided on a rear surface of the insulative substrate and respectively electrically connected to the via-holes in the region of the insulative substrate opposed to the island.

21. The semiconductor device according to claim 20, wherein the via-holes or the heat dissipation via-hole are filled with a metal filler.

22. The semiconductor device according to claim 19, wherein the first heat dissipation via-hole and the second heat dissipation via-hole are arranged alternately.

\* \* \* \* \*